United States Patent
Kanamori

(10) Patent No.: US 9,419,017 B2
(45) Date of Patent: Aug. 16, 2016

(54) ACTIVE MATRIX SUBSTRATE, DISPLAY DEVICE, AND SHORT CIRCUIT DEFECT CORRECTION METHOD FOR ACTIVE MATRIX SUBSTRATE

(75) Inventor: Teruki Kanamori, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 293 days.

(21) Appl. No.: 14/000,804

(22) PCT Filed: Feb. 16, 2012

(86) PCT No.: PCT/JP2012/001036
§ 371 (c)(1),
(2), (4) Date: Aug. 21, 2013

(87) PCT Pub. No.: WO2012/114688
PCT Pub. Date: Aug. 30, 2012

(65) Prior Publication Data
US 2013/0329158 A1 Dec. 12, 2013

(30) Foreign Application Priority Data
Feb. 22, 2011 (JP) .................................. 2011-035990

(51) Int. Cl.
| | |
|---|---|
| *G02F 1/1362* | (2006.01) |
| *G02F 1/13* | (2006.01) |
| *H01L 27/12* | (2006.01) |
| *H01L 21/02* | (2006.01) |
| *H01L 21/268* | (2006.01) |

(52) U.S. Cl.
CPC ...... *H01L 27/1214* (2013.01); *G02F 1/136213* (2013.01); *G02F 1/136259* (2013.01); *H01L 21/268* (2013.01); *G02F 1/1309* (2013.01); *G02F 2001/136263* (2013.01); *G02F 2001/136272* (2013.01); *G02F 2201/506* (2013.01); *G02F 2201/508* (2013.01)

(58) Field of Classification Search
CPC .................... G02F 1/136213; G02F 1/136259; G02F 1/136263; G02F 1/136268; G02F 1/136272; G02F 2001/136263; G02F 2001/136268; G02F 2201/506; G02F 2201/508; G02F 1/1309; G02F 2001/136272; G09G 2330/08; G09G 2330/12; G09G 2330/10; G09G 3/006; H01L 27/1214; H01L 27/124; H01L 27/1244; H01L 21/268
USPC ............. 349/39, 43, 54, 139, 192, 55; 345/93
See application file for complete search history.

(56) References Cited

U.S. PATENT DOCUMENTS

| | | | | |
|---|---|---|---|---|
| 5,608,558 | A * | 3/1997 | Katsumi | G09G 3/006 324/760.02 |
| 6,953,949 | B2 * | 10/2005 | Murade | G02F 1/136209 257/294 |
| 2007/0024786 | A1 * | 2/2007 | Tanaka | G02F 1/133707 349/139 |
| 2007/0081108 | A1 * | 4/2007 | Tsukada | G02F 1/136259 349/54 |
| 2008/0224991 | A1 * | 9/2008 | Chiou | G02F 1/167 345/107 |
| 2009/0279014 | A1 | 11/2009 | Okamoto et al. | |

FOREIGN PATENT DOCUMENTS

WO 2007/063649 A1 6/2007

* cited by examiner

*Primary Examiner* — Paisley L Arendt
*Assistant Examiner* — Angela Davison
(74) *Attorney, Agent, or Firm* — Chen Yoshimura LLP

(57) ABSTRACT

A slit-shaped repair hole (27S) for repairing a short circuit defect of adjacent pixel electrodes (27) is provided straddling a storage capacitance wiring line (22CsL) at at least one intersection of the edges of the pixel electrode (27) and the storage capacitance wiring line (22CsL).

8 Claims, 14 Drawing Sheets

(a)

(b)

ACTIVE MATRIX SUBSTRATE, DISPLAY DEVICE, AND SHORT CIRCUIT DEFECT CORRECTION METHOD FOR ACTIVE MATRIX SUBSTRATE

TECHNICAL FIELD

The present invention relates to an active matrix substrate, a display device, and a short circuit defect repair method for an active matrix substrate. More specifically, the present invention relates to: an active matrix substrate where, when adjacent pixel electrodes short circuit over a storage capacitance wiring line, repair of a short circuit defect is possible without lowering display quality and without significantly lowering the aperture ratio; a display device provided with the active matrix substrate; and a short circuit defect repair method that repairs the short circuit defect.

BACKGROUND ART

Liquid crystal display devices are widely used in displays for OA devices such as TVs and personal computers, and portable devices such as cellular phones and PDAs (Personal Digital Assistant).

Liquid crystal display panels generally have a structure in which a pair of transparent substrates are arranged opposing each other, with the edges thereof being bonded together with a sealing material. Liquid crystal is enclosed in the area sealed between the transparent substrates. One of the transparent substrates has a plurality of switching elements such as thin-film transistors (TFTs, hereinafter also referred to as "TFTs") disposed for respective pixels in a matrix, and also a plurality of pixel electrodes each connected to a switching element. The other transparent substrate has an opposite electrode formed on the surface thereof. An electric field generated between the pixel electrodes and the opposite electrode changes the orientation state of the liquid crystal molecules, and changes the transmittance of the light entering the liquid crystal display panel to obtain desired display images in the liquid crystal display device.

The higher resolution of recent liquid crystal display panels has made it easier for a short circuit to occur between wiring and electrodes. Thus, it is essential to repair display anomalies caused by this short circuiting between the wiring and electrodes. If two adjacent pixel electrodes short circuit with each other, for example, then the two entire pixels that have short circuited will be bright spots or defects, resulting in a need to repair these display defects.

If pixel electrodes have short circuited with each other, then in general a laser is radiated from the rear side of the liquid crystal display panel to sever the short circuit defect portion, in order to repair the defect. However, if the short circuit defect has occurred in a location overlapping wiring and the like on the TFT substrate, then when the laser is used to sever the short circuit defect portion, the wiring of the TFT substrate will also be severed by the laser. When a wiring line is severed without an auxiliary wiring line for repairing disconnection, such as a storage capacitance wiring line, new defects will occur due to the wiring line being disconnected. Therefore, a short circuit defect repair method that radiates a laser to sever the short circuit defect portion is unable to be applied when the short circuit defect has occurred over the storage capacitance wiring line.

If, as described above, a short circuit defect between pixel electrodes occurs in an area overlapping the storage capacitance wiring line, then in general defect repair is performed by turning the two pixels that have the short circuit defect portion therebetween into dark spots. Specifically, as shown in FIG. 18, a drain wiring line 124DL connected to an upper electrode 124Cs of a storage capacitance element is severed (area LS in FIG. 18), and the upper electrode 124Cs and a lower electrode 122Cs are fused to connect with each other (shaded area M in FIG. 18), and the potential of a pixel electrode 127 is maintained at the storage capacitance potential. This makes the two short circuited pixel electrodes 127 visible as dark spots.

However, it is easily visible when two entire short circuited pixel electrodes are turned into dark spots, and the deterioration in display quality is noticeable even if repair of the short circuit defect is performed. There is also a set standard for how many pixels in one display panel can be dark spots, and the liquid crystal display panel will be considered defective if this set number is exceeded. Thus, there is also the risk of a reduction in yield if pixels are turned into dark spots in order to repair short circuit defects.

In Patent Document 1, an active matrix substrate is disclosed that has pixel electrodes divided into a plurality of small areas, and each small area is integrally connected via an electrical connection part. It is disclosed that if adjacent pixel electrodes on this active matrix substrate short circuit with each other at a location overlapping a light-shielding object such as a wiring line, then the electrical connection part is severed by radiating laser light onto the electrical connection part, which connects the small area that has the short circuit defect portion to the other small areas of the plurality of small areas that form a single pixel electrode. The small area with the short circuit defect portion is electrically separated from the other small areas in order to be able to repair the display defect without turning the entire two short circuited pixel electrodes into dark spots.

RELATED ART DOCUMENT

Patent Document

Patent Document 1: Domestic Re-publication of PCT International Application No. 2007-063649

SUMMARY OF THE INVENTION

Problems to be Solved by the Invention

However, the method in Patent Document 1 has a problem in which large slits are provided in pixel electrodes to divide the pixel electrodes into a plurality of small areas, resulting in a corresponding reduction in the aperture ratio.

The present invention aims at providing: an active matrix substrate with a high aperture ratio where it is possible to repair short circuit defects, without turning the entire pixel into a dark spot, when adjacent pixel electrodes short circuit with each other in an area overlapping a storage capacitance wiring line; and a display device. Furthermore, the present invention aims at providing a method to repair short circuit defects without turning the entire pixel into a dark spot, and without significantly lowering the aperture ratio, when adjacent pixel electrodes on the high aperture ratio active matrix substrate short circuit with each other in an area overlapping a storage capacitance wiring line.

Means for Solving the Problems

A first aspect of the present invention for solving the above-mentioned problems is an active matrix substrate having a non-display area arranged in a periphery of a substrate, and a display area arranged in an area surrounded by the non-display area, the display area having a plurality of pixels arranged in a matrix therein, the active matrix substrate further including: a substrate; a plurality of gate wiring lines disposed in parallel with each other on the substrate; a plurality of storage capacitance wiring lines that form storage capacitance elements for the respective pixels, the storage capacitance wiring lines being disposed on the substrate so as to extend in parallel with the plurality of gate wiring lines, and so as to go across each of the pixels; a gate insulating film disposed on the substrate so as to cover the plurality of gate wiring lines and the plurality of storage capacitance wiring lines; a plurality of source wiring lines disposed on the gate insulating film, the plurality of source wiring lines being in parallel with each other and intersecting the plurality of gate wiring lines and the plurality of storage capacitance wiring lines; a plurality of switching elements disposed at respective intersections of the plurality of gate wiring lines and the plurality of source wiring lines; an interlayer insulating film disposed on the gate insulating film so as to cover the plurality of source wiring lines, and a plurality of pixel electrodes disposed on the interlayer insulating film for the respective plurality of pixels, wherein a slit-shaped repair hole for repairing a short circuit defect between adjacent pixel electrodes is provided in each of the pixel electrodes so as to straddle the storage capacitance wiring line, the slit-shaped repair hole being provided adjacent to at least one of intersections of the storage capacitance wiring line and edges of the plurality of the pixel electrode electrodes.

A second aspect of the present invention is the first aspect of the present invention, wherein the repair hole is provided at both intersections of the storage capacitance wiring line and the edges of the pixel electrode.

A third aspect of the present invention is the first or second aspect of the present invention, wherein a source auxiliary wiring line capable of electrically connecting to one end and another end, respectively, of each of the source wiring lines is disposed on the non-display area.

A fourth aspect of the present invention is any one aspect of the first to third aspect of the present invention, wherein at the edges of each pixel electrode, slit-shaped repair holes are provided adjacent to intersections of said edges and the storage capacitance wiring line, the slit-shaped repair holes straddling the source wiring lines.

A fifth aspect of the present invention is the fourth aspect of the present invention, wherein the repair holes provided so as to straddle the storage capacitance wiring line continues with the repair holes provided so as to straddle the source wiring line.

A sixth aspect of the present invention is any one aspect of the first to fifth aspect of the present invention, wherein a slit width of each of the repair holes is 5 to 6 µm, and a slit length thereof is 15 to 25 µm.

A seventh aspect of the present invention is a display device, including the active matrix substrate according to any one aspect of the first to sixth aspect of the present invention, an opposite substrate arranged opposing the active matrix substrate, and a display medium layer disposed therebetween.

An eighth aspect of the present invention is the seventh aspect of the present invention, wherein the display medium layer is a liquid crystal layer.

An active matrix substrate short circuit defect repair method for repairing a short circuit defect when two adjacent pixel electrodes short circuit above a storage capacitance wiring line in an active matrix substrate, the active matrix substrate having a non-display area arranged in a periphery of a substrate, and a display area arranged in an area surrounded by the non-display area, the display area having a plurality of pixels arranged in a matrix therein, the active matrix substrate further including: a substrate; a plurality of gate wiring lines disposed in parallel with each other on the substrate; a plurality of storage capacitance wiring lines that form storage capacitance elements for the respective pixels, the storage capacitance wiring lines being disposed on the substrate so as to extend in parallel with the plurality of gate wiring lines, and so as to go across each of the pixels; a gate insulating film disposed on the substrate so as to cover the plurality of gate wiring lines and the plurality of storage capacitance wiring lines; a plurality of source wiring lines disposed on the gate insulating film, the plurality of source wiring lines being in parallel with each other and intersecting the plurality of gate wiring lines and the plurality of storage capacitance wiring lines; a plurality of switching elements disposed at respective intersections of the plurality of gate wiring lines and the plurality of source wiring lines; an interlayer insulating film disposed on the gate insulating film so as to cover the plurality of source wiring lines; and a plurality of pixel electrodes disposed on the interlayer insulating film for the respective plurality of pixels, wherein a slit-shaped repair hole for repairing a short circuit defect between adjacent pixel electrodes is provided in each of the pixel electrodes so as to straddle the storage capacitance wiring line, the slit-shaped repair hole being provided adjacent to at least one of intersections of the storage capacitance wiring line and edges of the pixel electrode, the method including: when two pixel electrodes adjacent to each other short circuit over the storage capacitance wiring line: positioning a short circuit defect portion inside an area enclosed by the repair holes and laser radiation areas that continue, so as not to overlap the storage capacitance wiring line, to the repair holes, and performing laser radiation on the laser radiation areas, thereby electrically isolating the short circuit defect portion where the short circuit occurred from at least one of the pixel electrodes.

A tenth aspect of the present invention is the ninth aspect of the present invention, wherein the repair holes are provided at both intersections of the storage capacitance wiring line and the edges of the pixel electrode, and wherein a short circuit defect portion that the short circuit has occurred in is electrically isolated from the two pixel electrodes by positioning the short circuit defect portion inside the repair holes and laser radiation areas, the laser radiation areas continuing to the repair holes so as not to overlap the storage capacitance wiring line, and by performing laser radiation on the laser radiation areas.

An eleventh aspect of the present invention is the ninth or tenth aspect of the present invention, wherein a source auxiliary wiring line capable of electrically connecting to one end and another end, respectively, of each of the source wiring lines is disposed on the non-display area.

A twelfth aspect of the present invention is any one aspect of the ninth to eleventh aspect of the present invention, wherein at the edges of each pixel electrode, slit-shaped repair holes are provided adjacent to intersections of said edges and the storage capacitance wiring line, the slit-shaped repair holes straddling the source wiring lines.

A thirteenth aspect of the present invention is the twelfth aspect of the present invention, wherein the repair holes provided so as to straddle the storage capacitance wiring line continues with the repair holes provided so as to straddle the source wiring line.

A fourteenth aspect of the present invention is any one aspect of the ninth to thirteenth aspect of the present invention, wherein a slit width of each of the repair holes is 5 to 6 µm, and a slit length thereof is 15 to 25 µm.

Effects able to be obtained by the first to fourteenth aspect of the present invention will be described below.

According to the first aspect of the present invention, a slit-shaped repair hole that repairs a short circuit defect of adjacent pixel electrodes is provided, so as to straddle a storage capacitance wiring line, at at least one intersection of edges of each pixel electrode and the storage capacitance wiring line. Thus, if two adjacent pixel electrodes short circuit above a storage capacitance wiring line, the short circuit defect is able to be repaired using the repair hole. Specifically, laser radiation is performed to electrically isolate the short circuit defect portion, where the short circuit defect has occurred, from at least one of the two short circuited pixel electrodes. The laser radiation areas where laser radiation is performed are areas that continue to the repair holes and that do not overlap the capacitance wiring line, and are set such that the short circuit defect portion is located inside the area enclosed by the repair holes and laser radiation areas.

By using the repair hole as such, the short circuit defect can be repaired without turning the entire pixel into a dark spot, and an excellent display quality can be achieved. Furthermore, by using the repair hole as described above, the short circuit defect can be repaired without significantly decreasing the aperture ratio, and a high-luminance and low-power-consumption driving display device can be obtained. The short circuit defect can be repaired by merely providing the repair hole only on the intersection of the edges of the pixel electrode and the storage capacitance wiring line, and thus an active matrix substrate can be obtained that also has an excellent aperture ratio for pixels where short circuiting has not occurred.

According to the ninth aspect of the present invention, if two adjacent pixel electrodes short circuit over a storage capacitance wiring line, the slit-shaped repair hole provided at the respective edges of each pixel electrode is used to perform laser radiation on laser radiation areas that continue to the repair holes and that do not overlap the storage capacitance wiring line by positioning the short circuit defect portion inside the area enclosed by the repair holes and the laser radiation areas where the short circuit has occurred. This makes it possible to perform repair of the short circuit defect by electrically isolating the short circuit defect portion from at least one of the two pixel electrodes, thereby repairing the short circuit defect without turning the entire pixel into a dark spot, and enabling an excellent display quality to be achieved. Furthermore, the short circuit defect can be repaired without significantly decreasing the aperture ratio, and a high-luminance and low-power-consumption driving display device can be obtained.

According to the second and tenth aspect of the present invention, repair holes are provided at both intersections of the edges of the pixel electrode and the storage capacitance wiring line, so if two adjacent pixel electrodes short circuit above the storage capacitance wiring line, then the short circuit defect portion will occur at an area positioned between the repair hole of one of the pixel electrodes and the repair hole of the other pixel electrode. Therefore, the short circuit defect portion is able to be positioned in the area enclosed by the repair holes and the laser radiation areas by the areas that continue from a slit end of one repair hole to a slit end of another repair hole being designated as the laser radiation areas. This makes it possible to electrically isolate the short circuit defect portion from both of the two pixel electrodes.

According to the third and eleventh aspect of the present invention, a source auxiliary wiring line capable of electrically connecting to one end and the other end, respectively, of the source wiring line is disposed on the non-display area. Therefore, when short circuit defect repair is performed between the two adjacent pixel electrodes, even if laser radiation is performed across the source wiring line and disconnects the source wiring line, a source signal can be sent to the source wiring line, due to the source auxiliary wiring line and the source wiring line being electrically connected on the non-display area.

According to the fourth and twelfth aspect of the present invention, at the edges of each pixel electrode, slit-shaped repair holes are provided adjacent to intersections of the edges of the pixel electrode and the storage capacitance wiring line, so as to straddle the storage capacitance wiring line. Therefore, short circuit defect repair is able to be performed without disconnecting the source wiring line, by performing laser radiation on the area that connects the repair hole straddling the storage capacitance wiring line and the repair hole straddling the source wiring line.

According to the fifth and thirteenth aspect of the present invention, the repair hole provided so as to straddle the storage capacitance wiring line, and the repair hole provided so as to straddle the source wiring line continue to each other, and thus the short circuit defect portion is able to be more reliably electrically isolated from the pixel electrodes.

According to the sixth and fourteenth aspect of the present invention, the slit width of the repair holes is 5 to 6 µm, and the slit length is 15 to 25 µm, thus a large area of the pixel electrodes can be secured, and an active matrix substrate with an excellent aperture ratio can be obtained.

According to the seventh aspect of the present invention, a display device includes an active matrix substrate, which has repair holes that are capable of undergoing short circuit defect repair when two adjacent pixel electrodes have short circuited above a storage capacitance wiring line, the active matrix substrate having a high aperture ratio, an opposite substrate opposing the active matrix substrate, and a display medium layer disposed therebetween. Thus, a high-luminance and low-power-consumption driving display device can be obtained.

According to the eighth aspect of the present invention, a high-luminance and low-power-consumption driving liquid crystal display device can be obtained.

Effects of the Invention

According to the present invention, a slit-shaped repair hole that repairs a short circuit defect of adjacent pixel electrodes is provided, so as to straddle a storage capacitance wiring line, at at least one intersection of the edges of the pixel electrode and storage capacitance wiring line. Thus, if two adjacent pixel electrodes short circuit over a storage capacitance wiring line, the short circuit defect is able to be repaired using the repair holes. Specifically, laser radiation is performed to electrically isolate the short circuit defect portion, where the short circuit defect has occurred, from at least one of the two short circuited pixel electrodes. The laser radiation areas where laser radiation is performed are areas that continue to the repair holes and that do not overlap the storage capacitance wiring line. These laser radiation areas are set such that the short circuit defect portion is enclosed inside the area made by the repair holes and laser radiation areas. By using the repair hole as such, the short circuit defect can be repaired without turning the entire pixel into a dark spot, and an excellent display quality can be achieved. Furthermore, by using the repair hole as such, the short circuit defect can be repaired without significantly decreasing the aperture ratio, and a high-luminance and low-power-consumption driving display device can be obtained. The short circuit defect can be repaired by merely providing the repair hole only at the intersection of the edges of the pixel electrode and the storage capacitance wiring line, and thus an active matrix substrate can be obtained that also has an excellent aperture ratio for pixels where short circuiting has not occurred.

DETAILED DESCRIPTION OF EMBODIMENTS

Exemplary embodiments of the present invention will be explained in detail below with reference to the drawings. Each individual embodiment does not necessarily need to fulfill all of the aims as described later. Furthermore, all of the embodiments do not necessarily need to fulfill each individual aim as described later.

Embodiment 1

First, a liquid crystal display device 10 according to Embodiment 1, and a short circuit defect repair method for when two adjacent pixel electrodes 27 short circuit over a storage capacitance wiring line 22CsL, will be explained.

Liquid Crystal Display Device

Figure 1:
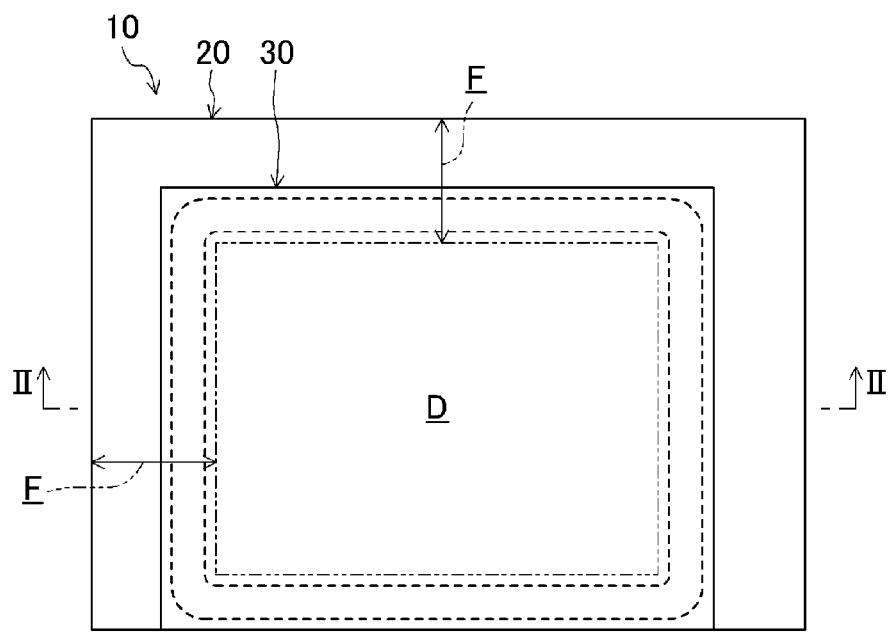
FIG. 1 is a schematic plan view of a liquid crystal display device.
Figure 2:
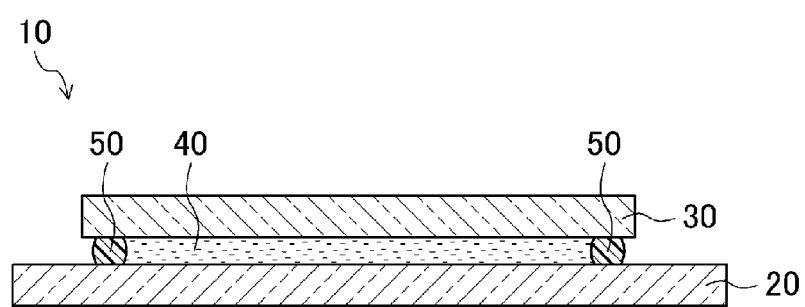
FIG. 2 is a cross-sectional view along the line II-II in FIG. 1.
Figure 3:
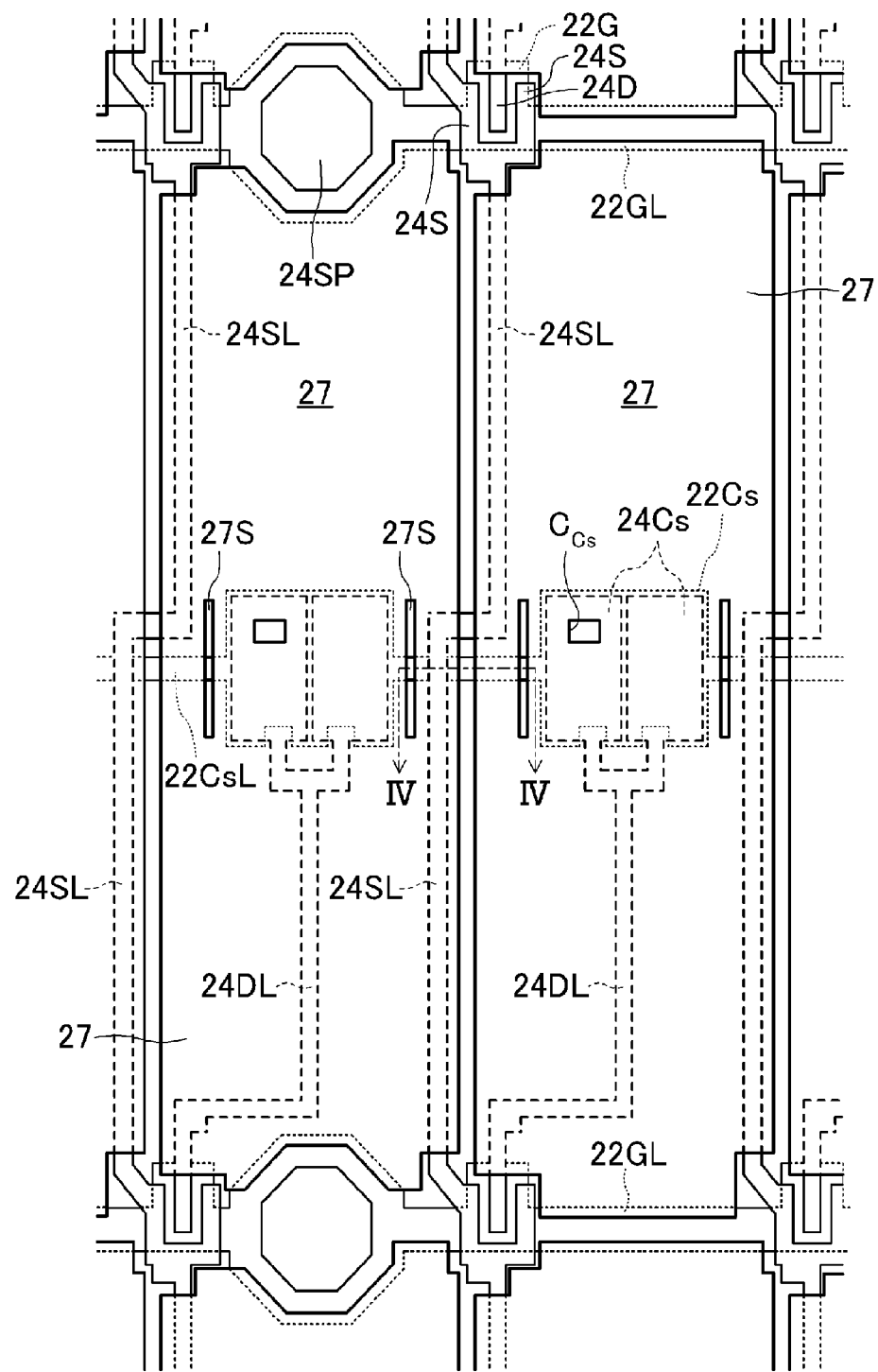
FIG. 3 is a plan view of an enlarged display area on an active matrix substrate in Embodiment 1.
Figure 4:
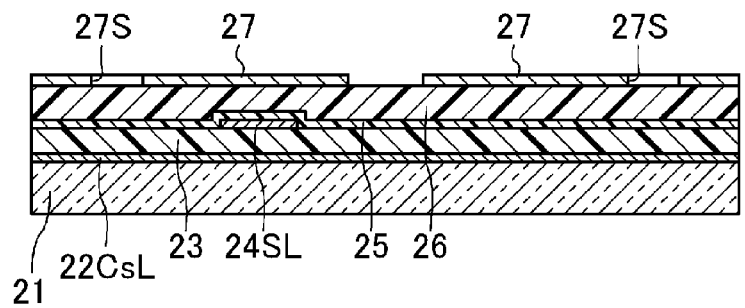
FIG. 4 is a cross-sectional view along the line IV-IV in FIG. 3.

FIG. 1 is a plan view of the liquid crystal display device 10 in Embodiment 1, and FIG. 2 is a cross-sectional view along the line II-II in FIG. 1. FIG. 3 is a plan view of an enlarged display area D on the active matrix substrate 20 in Embodiment 1, and FIG. 4 is a cross-sectional view along the line IV-IV in FIG. 3.

The liquid crystal display device 10 has the active matrix substrate 20 and an opposite substrate 30 arranged opposing each other, and the substrates are bonded together by a sealing material 50 on the edges thereof. A liquid crystal layer 40 is provided as a display medium layer in the area surrounded by the sealing material 50. Spacers 24SP supporting the opposite substrate 30 are disposed as necessary on the active matrix substrate 20 (see FIG. 3).

In the liquid crystal display device 10, the display area D, which performs image display, is arranged on a portion inside the sealing material 50, and a non-display area F is arranged on areas of the substrate peripheries, which encompass the display area D. A plurality of pixels are arranged in a matrix in the display area D.

This liquid crystal display device 10 uses $UV^2A$ liquid crystal (UltraViolet induced multi-domain Vertical Alignment liquid crystal) technology, which has an alignment film formed by a thin-film organic polymer compound. A certain interval of ultraviolet radiation exposed onto this alignment film tilts side chains of the organic polymer compound in the direction of the ultraviolet radiation. In $UV^2A$ liquid crystal, photo-alignment technology controls the tilt of side chains of the organic polymer compound that forms the alignment film, so there is no need to provide ribs inside the panel or slits in the pixel electrodes, unlike a Multi-domain Vertical Alignment (MVA) liquid crystal panel. This makes it possible to obtain a panel with a high aperture ratio. Accordingly, this can be a liquid crystal display panel that has display quality and power consumption superior to that of a liquid crystal display panel with ribs and slits.

Active Matrix Substrate

As shown in FIG. 3, the active matrix substrate 20 has a plurality of gate wiring lines 22GL disposed in parallel with each other, and a plurality of source wiring lines 24SL disposed in parallel with each other intersecting each of the gate wiring lines 22GL on the display area D. Each pixel is arranged in an area demarcated by the gate wiring lines 22GL and the source wiring lines 24SL, and a TFT as a switching element for driving each pixel is disposed on each intersection of the gate wiring lines 22GL and the source wiring lines 24SL. The TFT includes a gate electrode 22G, a semiconductor layer (not shown), a source electrode 24S, and a drain electrode 24D.

Source auxiliary wiring lines 22SL are disposed on the non-display area F so as to be able to repair the source wiring lines 24SL if the source wiring lines 24SL are disconnected. The source auxiliary wiring lines 22SL are disposed in the same layer as the gate wiring lines 22GL. One end of the source auxiliary wiring lines 22SL is located in the vicinity of one end of the source wiring lines 24SL, and the source auxiliary wiring lines 22SL extend so as to go around on the non-display area F, with the other end being located in the vicinity of the other end of the source wiring lines 24SL (see FIG. 8). The source auxiliary wiring lines 22SL are not in contact with the source wiring lines 24SL when there is no abnormality with the source wiring lines 24SL (see FIG. 9(a)).

A storage capacitance wiring line 22CsL is disposed on the active matrix substrate 20 so as to extend in parallel with the plurality of gate wiring lines 22GL and to cross over each pixel. One portion of the storage capacitance wiring line 22CsL forms a lower electrode 22Cs of a storage capacitance element for each pixel, and a storage capacitance is formed by an upper electrode 24Cs connected to the drain electrode 24D via a drain wiring line 24DL, and a lower electrode 22Cs arranged opposing each other. A substantially rectangular pixel electrode 27 is provided for each pixel. The upper electrode 24Cs and the pixel electrode 27 are disposed so as to be electrically connected via a contact hole $C_{Cs}$.

In terms of a layered structure, the active matrix substrate 20 has the following layered onto a substrate 21: a conductive film containing the gate electrodes 22G, the gate wiring lines 22GL, the storage capacitance wiring lines 22CsL, the lower electrodes 22Cs, the source auxiliary wiring lines 22SL, and the like; a conductive film containing a gate insulating film 23, a semiconductor film (not shown), the source electrodes 24S, the drain electrodes 24D, the source wiring lines 24SL, and the like; and a passivation film 25, an interlayer insulating film 26, the pixel electrodes 27, and an alignment film (not shown).

The following has a well-known structure: the substrate 21, the gate electrodes 22G, the gate wiring lines 22GL, the storage capacitance wiring line 22CsL, the lower electrodes 22Cs, the gate insulating film 23, the semiconductor film, the source electrodes 24S, the drain electrodes 24D, the drain wiring lines 24DL, the source wiring lines 24SL, the upper electrodes 24Cs, the spacers 24SP, the passivation film 25, and the interlayer insulating film 26.

Pixel Electrode and Repair Hole

The pixel electrodes 27 are formed of a transparent conductive film such as an ITO (indium tin oxide) film, and are formed of an ITO film with a thickness of about 20 to 300 nm, for example.

A repair hole 27S is provided at intersections of the edges of the pixel electrode 27 and the storage capacitance wiring line 22CsL. Since the storage capacitance wiring line 22CsL is disposed so as to go across each pixel, there are two intersections of the edges of the pixel electrode 27 and the storage capacitance wiring line 22CsL for each pixel electrode 27. The repair hole 27S is formed at both of those two intersections. The repair hole 27S is above the storage capacitance wiring line 22CsL, and is formed in a slit shape straddling the storage capacitance wiring line 22CsL. The direction of the slit of the repair hole 27S is perpendicular to the direction in which the storage capacitance wiring line 22CsL extends. The repair hole 27S is slit-shaped holes with a slit width of about 5 to 6 μm and a slit length of about 15 to 25 μm. The repair hole 27S is formed in a location within about 18 to 25 μm from the edge of the pixel electrode 27.

Opposite Substrate

Although not shown in the figure, an opposite substrate 30 has a color filter layer disposed thereon provided with a light-shielding layer and a colored layer. A common electrode is disposed so as to cover the color filter layer, and an alignment film is disposed so as to cover the common electrode.

Liquid Crystal Layer

The liquid crystal layer 40 is made of a nematic liquid crystal material that has electrooptic characteristics, for example.

Operation of Liquid Crystal Display Device

In each pixel in the liquid crystal display device 10 with the configuration described above, a gate signal is sent from a gate driver to the gate electrode 22G via the gate wiring line 22GL. When a TFT in the display area D is in an ON state, a source signal is sent from a source driver to the source electrode 24S via the source wiring line 24SL on the TFT, and a prescribed charge is written to the pixel electrode 27 via the semiconductor film and drain electrode 24D. An opposite signal is inputted to the common electrode on the opposite substrate 30. Then, a difference in potential occurs between each pixel electrode 27 on the active matrix substrate 20 and the common electrode on the opposite substrate 30, which generates an electric field in the liquid crystal layer 40. In each pixel in the liquid crystal display device 10, the orientation state of the liquid crystal molecules in the liquid crystal layer 40 changes depending on the strength of the electric field generated in the liquid crystal layer 40, thereby adjusting the light transmittance of the liquid crystal layer 40 to display an image. At this time, the storage capacitance wiring line 22CsL suppresses fluctuation in the voltage applied to the liquid crystal, which is caused by a leakage current flowing into the liquid crystal through the gate due to the voltage applied to the gate electrode.

Manufacturing Method for Active Matrix Substrate

Next, the manufacturing method for the active matrix substrate 20 will be described below.

First, sputtering or the like is used to deposit a conductive film on the substrate 21, and patterning is performed with photolithography to form the gate electrodes 22G, gate wiring lines 22GL, storage capacitance wiring lines 22CsL, lower electrodes 22Cs, source auxiliary wiring lines 22SL, and the like. The conductive film is a single layer film or a multilayer film of a metal such as titanium, chromium, aluminum, molybdenum, tantalum, tungsten, or copper, and is formed with a thickness of 100 to 300 nm, for example.

Next, the gate insulating film 23 made of a silicon nitride film or the like, and the semiconductor film are formed in succession using PECVD or the like, and photolithography or the like is used to pattern the semiconductor film, for example.

Then, sputtering or the like is used to deposit a conductive film on the gate insulating film 23, and patterning is performed with photolithography to form the source electrodes 24S, drain electrodes 24D, drain wiring lines 24DL, source wiring lines 24SL, upper electrodes 24Cs, spacers 24SP, and the like. At this time, the conductive film is a single layer film or a multilayer film of a metal such as titanium, chromium, aluminum, molybdenum, tantalum, tungsten, or copper, and is formed with a thickness of 100 to 300 nm, for example.

Next, PECVD or the like is used to deposit the passivation film 25 with a $SiO_2$ film having a thickness of about 50 to 500 nm, for example, and spin coating or the like is used to deposit the interlayer insulating film 26 with a photosensitive acrylic resin film having a thickness of about 2000 to 4000 nm, for example. The formation of the passivation film 25 is optional.

Next, sputtering or the like is used to deposit a transparent conductive film on the interlayer insulating film 26, and patterning is performed with photolithography to form the pixel electrodes 27. During this patterning, the slit-shaped repair hole 27S, which straddles the storage capacitance wiring line 22CsL, is simultaneously formed at the intersections of the edges of the pixel electrodes 27 and the storage capacitance wiring line 22CsL. The transparent conductive film is an ITO film or IZO film, and is deposited at a thickness of 100 to 200 nm, for example.

Finally, an alignment film is formed by coating so as to cover the interlayer insulating film 26 and the pixel electrodes 27, and then the active matrix substrate 20 is complete. This active matrix substrate 20 can be made into the liquid crystal display device 10 by being bonded together with the opposite substrate 30 with the sealing material 50 and by providing the liquid crystal layer 40 between the two substrates.

After the active matrix substrate 20 is completed, a check is performed to detect defects on the active matrix substrate.

Short Circuit Defect Repair Method

In the checking process for the active matrix substrate 20 described above, as shown in FIGS. 5 and 6 there are times when short circuiting will be detected among the adjacent pixel electrodes 27 above the storage capacitance wiring line 22CsL (see short circuit defect portion A in the drawings). The short circuit defect repair method used for such a time will be described using FIGS. 7 to 9.

Figure 7:
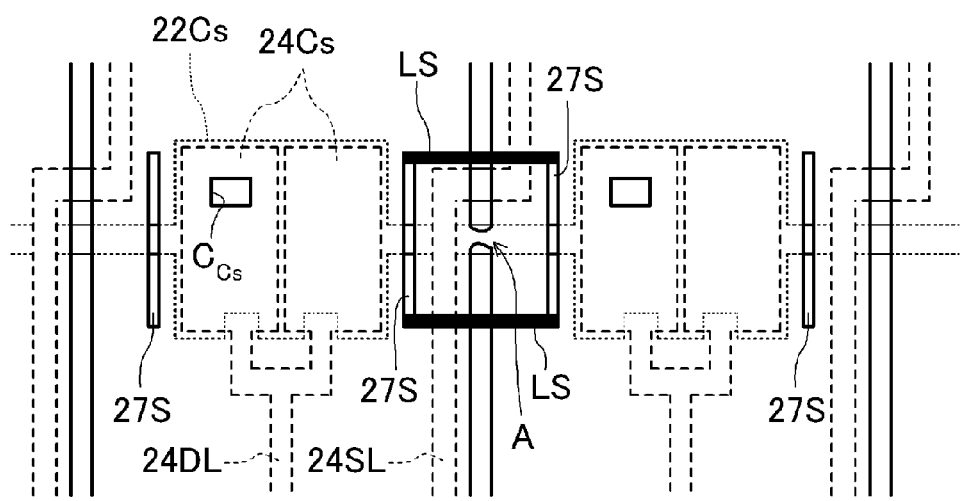
FIG. 7 is a view showing a short circuit defect repair method for an active matrix substrate according to Embodiment 1.

A short circuit defect portion A identified in the checking process is positioned between the repair hole 27S provided in one pixel electrode 27 and the repair hole 27S provided in the other pixel electrode 27. As shown in FIG. 7, laser radiation is performed from the rear side of the substrate with the areas respectively connecting the top and bottom of these two repair holes 27S set as laser radiation areas LS (the black areas denoted by reference character "LS" in this drawing and the following drawings are the laser radiation areas). Here, the laser radiation areas LS are configured to be areas that do not overlap the storage capacitance wiring line 22CsL. The type of laser used is a YAG laser (1024 nm wavelength) or the like, for example. The width of the laser radiation areas LS is about 4 to 5 µm, for example.

Laser radiation is performed in the laser radiation areas LS to make the conductive film forming the pixel electrodes 27 on the laser radiation areas LS lose conductivity, in order to electrically isolate the area enclosed by the repair holes 27S and laser radiation areas LS from the two pixel electrodes 27. The problematic short circuit defect portion A is included in this isolated portion, so the short circuiting of the two pixel electrodes 27 is stopped.

The laser radiation areas LS are configured so as to go across the source wiring line 24SL, and so the laser radiation disconnects the source wiring line 24SL. Therefore, the source auxiliary wiring lines 22SL are then used to repair the disconnection of the source wiring line 24SL.

Figure 8:
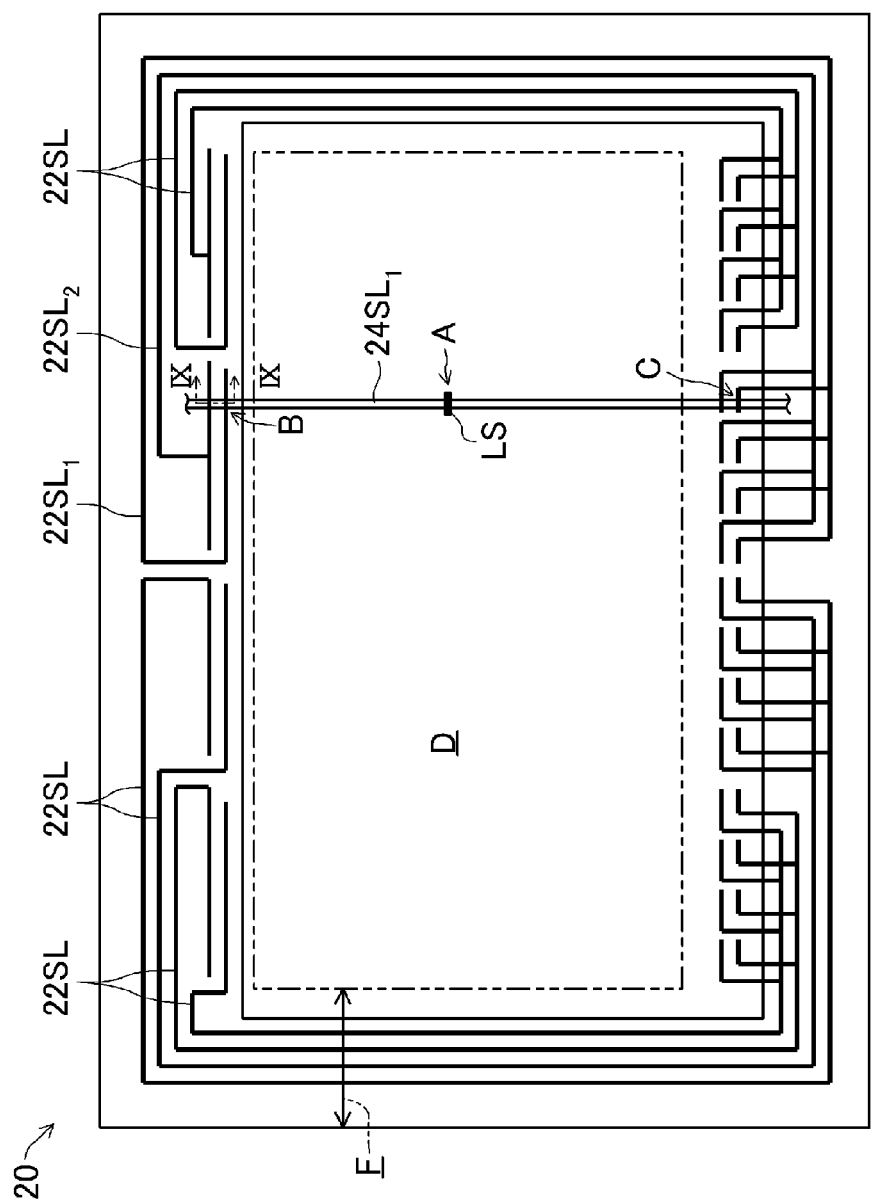
FIG. 8 is a plan view showing source auxiliary wiring lines on an active matrix substrate.
Figure 9:
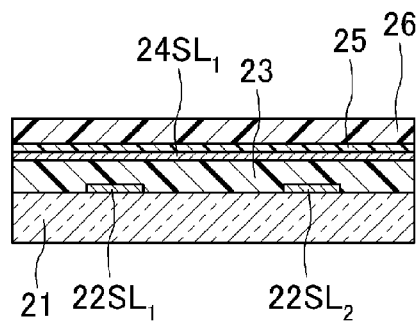
FIGS. 9(a) and 9(b) are cross-sectional views along the line IX-IX in FIG. 8.
Figure 9:
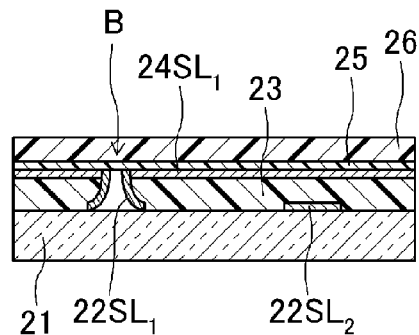

FIG. 8 is a plan view of the active matrix substrate 20 with a portion of the source auxiliary wiring lines 22SL disposed on the non-display area F being enlarged. Here, of the large number of source wiring lines 24SL provided, only one (24SL$_1$) is shown, having been disconnected at the laser radiation area LS in order to stop the short circuiting of the short circuit defect portion A.

In regards to a cross-section along the line IX-IX in FIG. 8, FIG. 9(a) shows a state before disconnection repair, and FIG. 9(b) shows a state after disconnection repair of the source wiring line 24SL$_1$. When the source wiring line 24SL$_1$ is disconnected at the laser radiation area LS, as shown in FIG. 9(b) the source wiring line 24SL$_1$ and the source auxiliary wiring line 22SL$_1$ are electrically connected at an intersection B of the source auxiliary wiring line 22SL$_1$ on one end of the source wiring line 24SL$_1$. Specifically, at the intersection B, laser radiation from the rear side of the active matrix substrate 20 fuses the source auxiliary wiring line 22SL$_1$ and breaks the gate insulating film 23 to electrically connect the source wiring line 24SL$_1$ with the source auxiliary wiring line 22SL$_1$. Intersection C of the source auxiliary wiring line 22SL$_1$ on the other end of the source wiring line 24SL$_1$, is the same. This causes the source signals for the source wiring line 24SL$_1$ to be given to the source wiring line 24SL$_1$ via the source auxiliary wiring line 22SL$_1$.

Thus, repair of the short circuit defects is completed without disconnecting the storage capacitance wiring line 22CsL, without turning the entire pixel into a dark spot, and without significantly decreasing the aperture ratio.

The repair of the disconnection of the source wiring line 24SL was described as happening after the short circuiting between the pixel electrodes 27 was stopped with laser radiation, but either one may be done first.

Effects of Embodiment 1

According to Embodiment 1, the area enclosed by the repair holes 27S and the laser radiation areas LS is electrically isolated from the two pixel electrodes 27 in order to stop short circuiting, and thus repair of the short circuit defect can be performed without turning the entire pixel into a dark spot. Furthermore, repair of the short circuit defect can be performed without significantly reducing the aperture ratio, and a high-luminance and low-power-consumption active matrix substrate 20 can be obtained.

Modification Example for Embodiment 1

Figure 5:
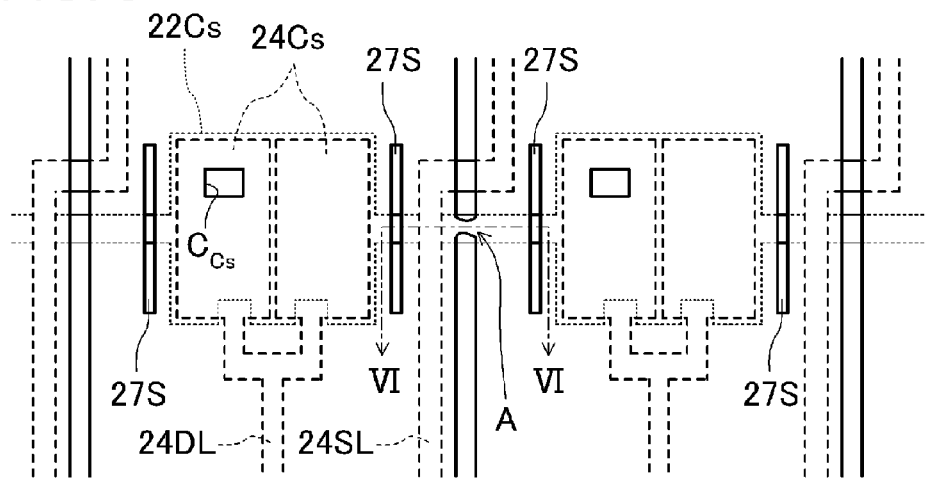
FIG. 5 is a view showing an example of short circuit defect occurrence between pixel electrodes.
Figure 6:
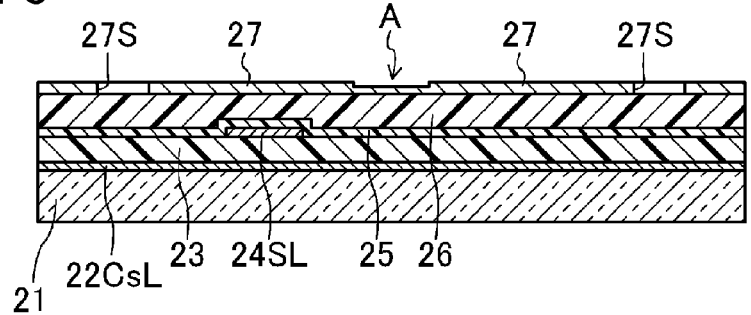
FIG. 6 is a cross-sectional view along the line VI-VI in FIG. 5.
Figure 10:
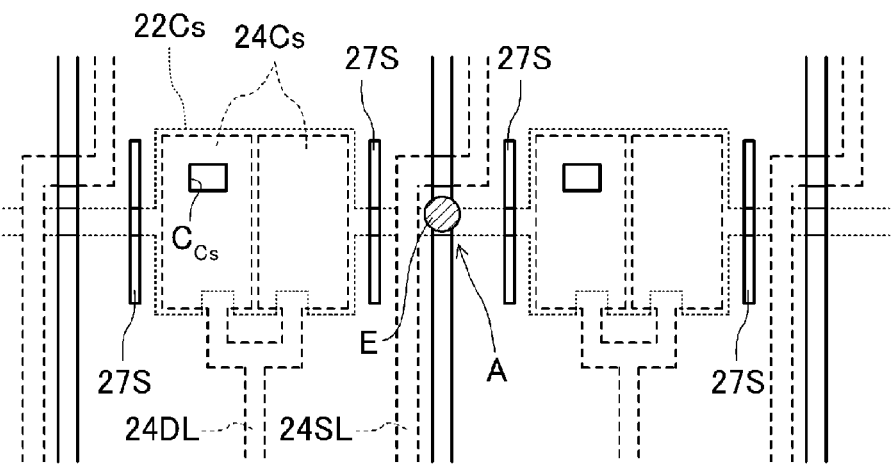
FIG. 10 is a view showing an example of short circuit defect occurrence between pixel electrodes.
Figure 11:
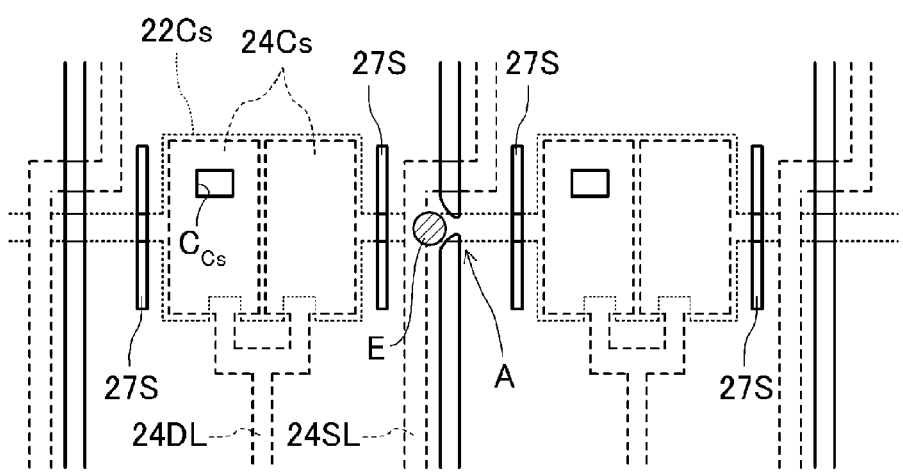
FIG. 11 is a view showing an example of short circuit defect occurrence between pixel electrodes.

In Embodiment 1, as shown in FIG. 5, a short circuit occurring due to film residue left at the time of formation of the pixel electrodes 27 was described, but it is possible for short circuiting to occur among the pixel electrodes 27 for other reasons, too. As shown in FIG. 10, short circuiting will also occur among the pixel electrodes 27 due to a conductive foreign object E being present between the two pixel electrodes 27, for example. As shown in FIG. 11, the presence of the foreign object E on the periphery of the pixel electrode 27 causes film residue to be left during formation of the pixel electrodes 27, and short circuiting will occur among the pixel electrodes 27.

Figure 12:
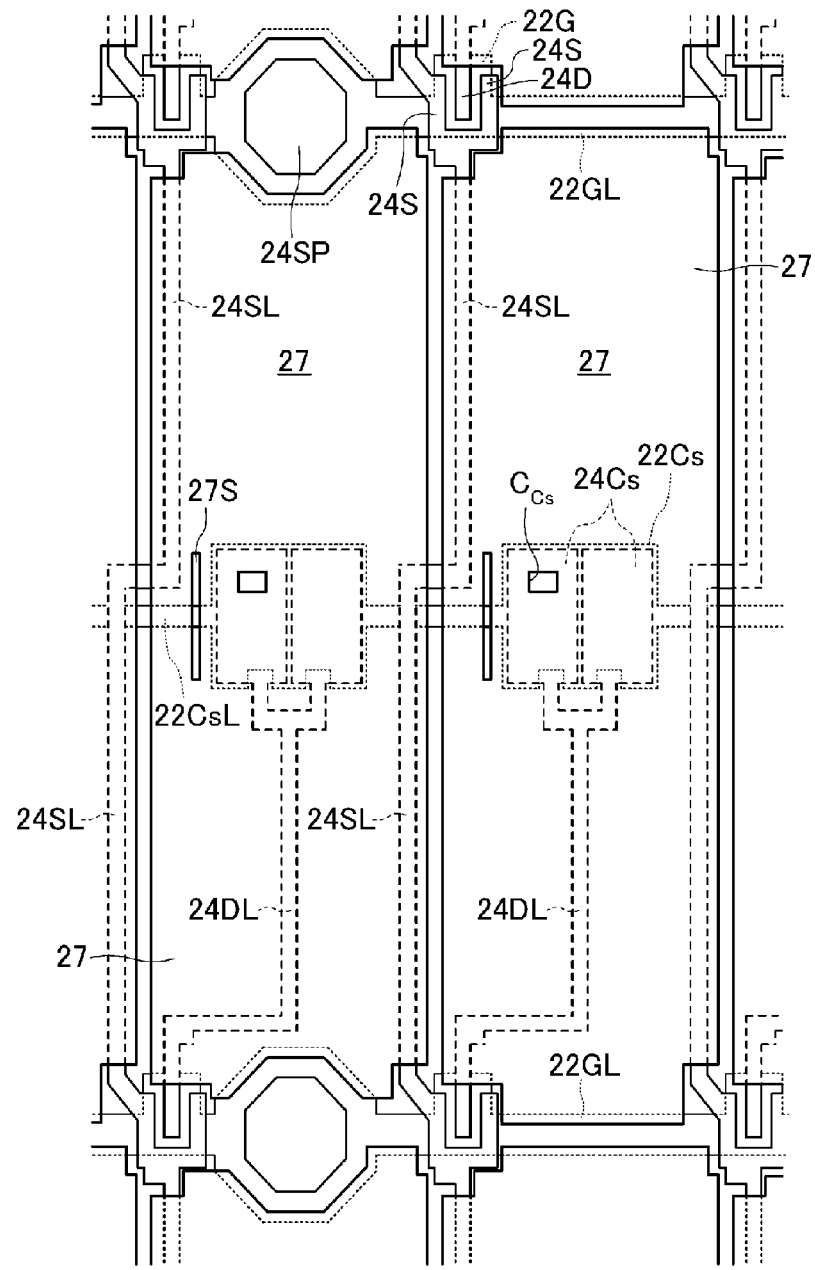
FIG. 12 is a plan view of an enlarged display area on the active matrix substrate in a modification example of Embodiment 1.
Figure 13:
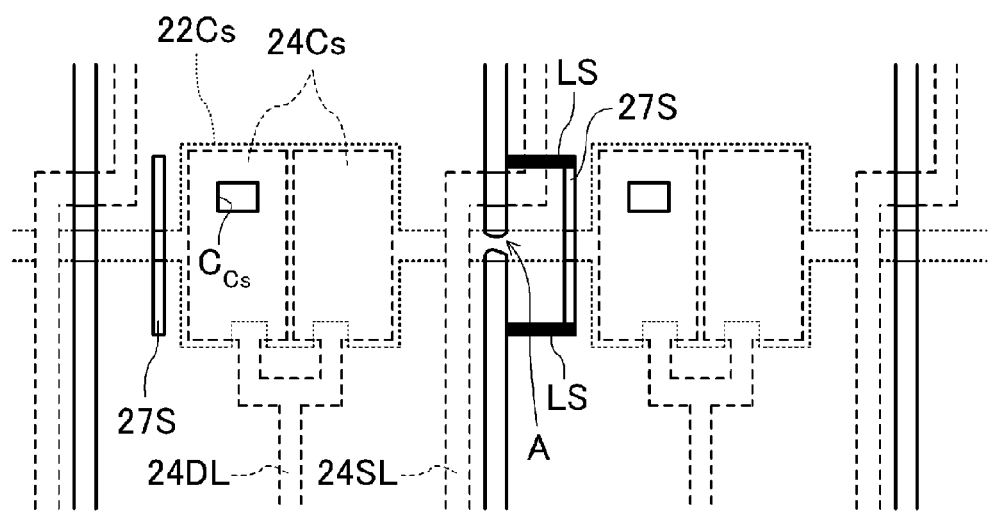
FIG. 13 is a view showing a short circuit defect repair method for an active matrix substrate in a modification example of Embodiment 1.

In Embodiment 1, each pixel electrode 27 was described as having two repair holes 27S, but as shown in FIG. 12, repair of short circuit defects can be performed even if each pixel electrode 27 has only one repair hole 27S. In this case, as shown in FIG. 13, during repair of the short circuit defect, the laser radiation is performed with the area extending toward the gap between the two short circuited pixel electrodes 27 from the top of the repair hole 27S and the area extending toward the gap between the two short circuited pixel electrodes 27 from the bottom of the repair hole 27S configured as the laser radiation areas LS. In this case, the short circuit defect portion A is positioned inside the repair hole 27S and the laser radiation areas LS following thereto, thereby making it possible to isolate the short circuit defect portion A from the right pixel electrode 27.

Embodiment 2

Next, a liquid crystal display device 10, and a short circuit defect repair method according to Embodiment 2, for when short circuiting occurs among two adjacent pixel electrodes 27 above a storage capacitance wiring line 22CsL, will be described.

Liquid Crystal Display Device

The liquid crystal display device 10 of Embodiment 2 has the same configuration as Embodiment 1, except that the repair hole 27S provided in the pixel electrodes 27 has a different shape.

Figure 14:
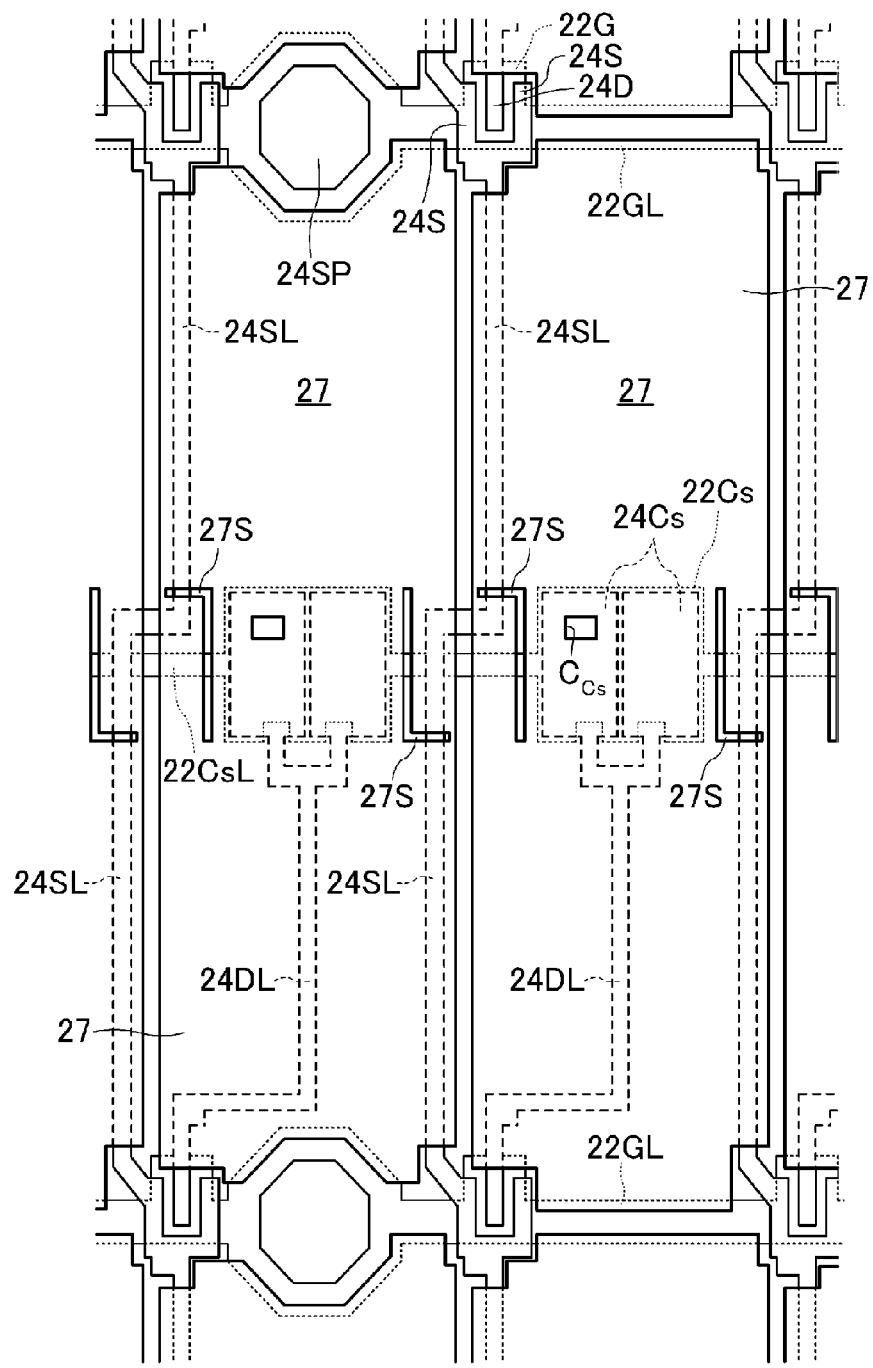
FIG. 14 is a plan view of an enlarged display area on an active matrix substrate according to Embodiment 2.

The repair hole 27S is provided at intersections of the edges of the pixel electrodes 27 and a storage capacitance wiring line 22CsL. The repair hole 27S, as shown in FIG. 14, is formed at both intersections of the edges of the pixel electrodes 27 and the storage capacitance wiring line 22CsL. The repair holes 27S straddle the storage capacitance wiring line 22CsL above the storage capacitance wiring line 22CsL, and have an "L"-shaped slit so as to straddle a source wiring line 24SL above the source wiring line 24SL. The repair hole 27S is formed so as to straddle the storage capacitance wiring line 22CsL on a portion of the pixel electrode 27 further away from the edge than the source wiring line 24SL. The slit width of the repair hole 27S is about 4 to 5 nm, and the entire length of the "L"-shaped portion of the repair hole 27S is about 25 to 35 nm, for example.

This liquid crystal display device 10 can be manufactured using the same method described in Embodiment 1.

Short Circuit Defect Repair Method

The short circuit defect repair method will be explained below for when adjacent pixel electrodes 27 are detected to have short circuited with each other above the storage capacitance wiring line 22CsL during the checking process of an active matrix substrate 20 in Embodiment 2.

Figure 15:
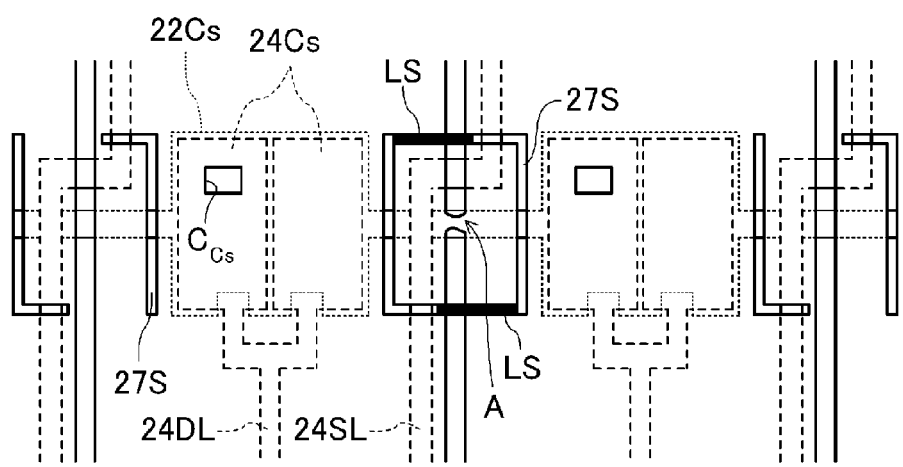
FIG. 15 is a view showing a short circuit defect repair method for an active matrix substrate according to Embodiment 2.

The short circuit defect portion A identified in the checking process is positioned between the repair hole 27S provided in one pixel electrode 27 and the repair hole 27S provided in the other pixel electrode 27. As shown in FIG. 15, laser radiation is performed from the rear side of the substrate with the areas respectively connecting the ends of these two repair holes 27S to each other as the laser radiation areas LS. Here, the laser radiation areas LS are configured to be areas that do not overlap the storage capacitance wiring line 22CsL and the source wiring line 24SL. At this time, the type of laser used is a YAG laser (1024 nm wavelength) or the like, for example. The width of the laser radiation areas LS are about 4 to 5 µm, for example.

Laser radiation is performed in the laser radiation areas LS to make the conductive film forming the pixel electrodes 27 on the laser radiation areas LS lose conductivity, in order to electrically isolate the area enclosed by the repair holes 27S and laser radiation areas LS from the two pixel electrodes 27. The problematic short circuit defect portion A is included in this isolated portion, so the short circuiting of the two pixel electrodes 27 is stopped.

Thus, repair of the short circuit defects is completed without disconnecting the storage capacitance wiring line 22CsL or the source wiring line 24SL, without turning the entire pixel into a dark spot, and without significantly decreasing the aperture ratio.

Effects of Embodiment 2

According to Embodiment 2, the area enclosed by the repair holes 27S and the laser radiation areas LS is electrically isolated from the two pixel electrodes 27 in order to stop short circuiting, and thus repair of the short circuit defect can be performed without turning the entire pixel into a dark spot. Furthermore, repair of the short circuit defect can be performed without significantly reducing the aperture ratio, and a high-luminance and low-power-consumption active matrix substrate 20 can be obtained.

According to Embodiment 2, since the repair holes 27S are provided so as to not just straddle the storage capacitance wiring line 22CsL but also the source wiring line 24SL, it is possible to configure the laser radiation areas LS to be areas where the laser radiation area LS does not go across the source wiring line. Therefore, the laser radiation for stopping the short circuiting of the pixel electrodes 27 will not disconnect the source wiring line 24SL, and the step to perform repair of the disconnection of the source wiring line 24SL using the source auxiliary wiring line 22SL can be omitted.

Modification Example for Embodiment 2

Figure 16:
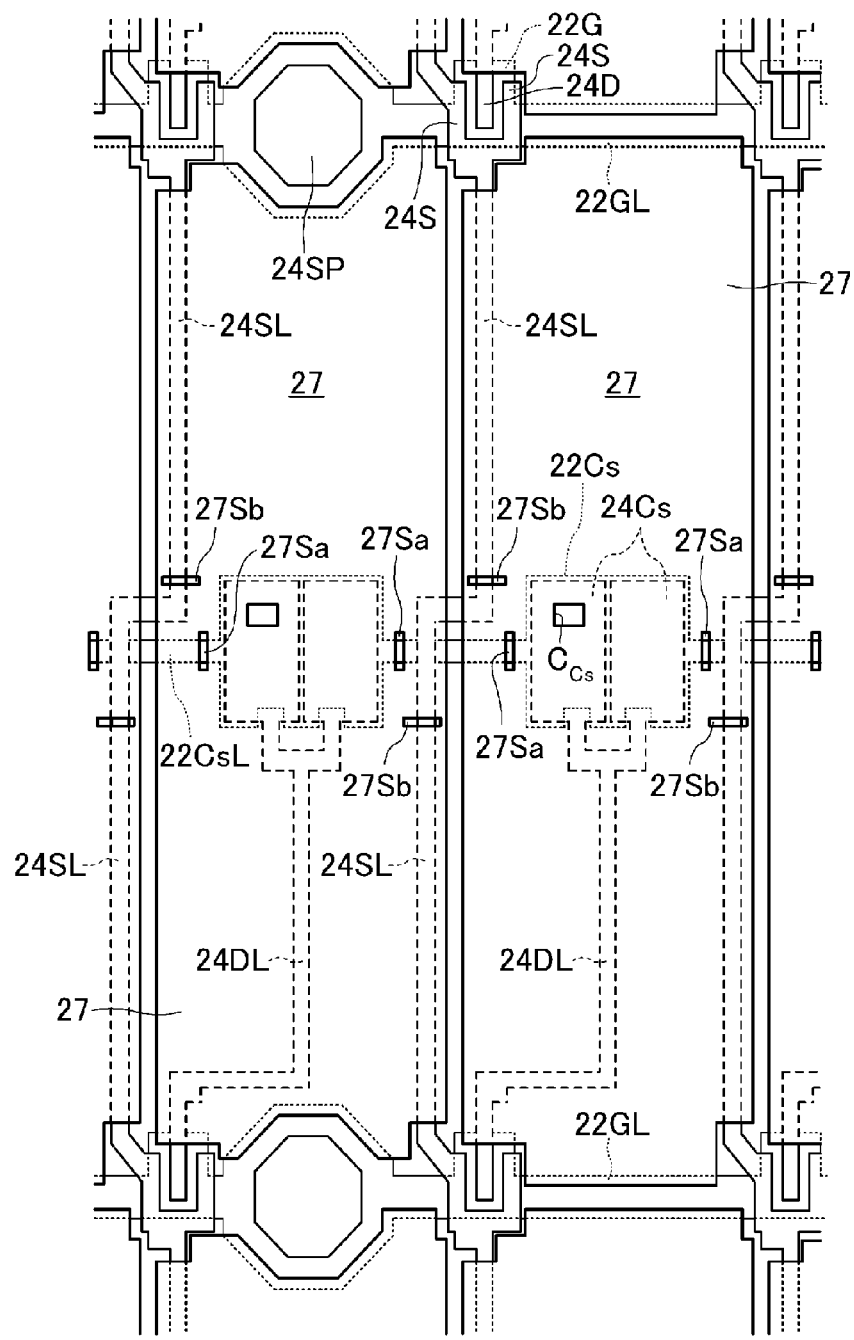
FIG. 16 is a plan view of an enlarged display area on the active matrix substrate in a modification example of Embodiment 2.
Figure 17:
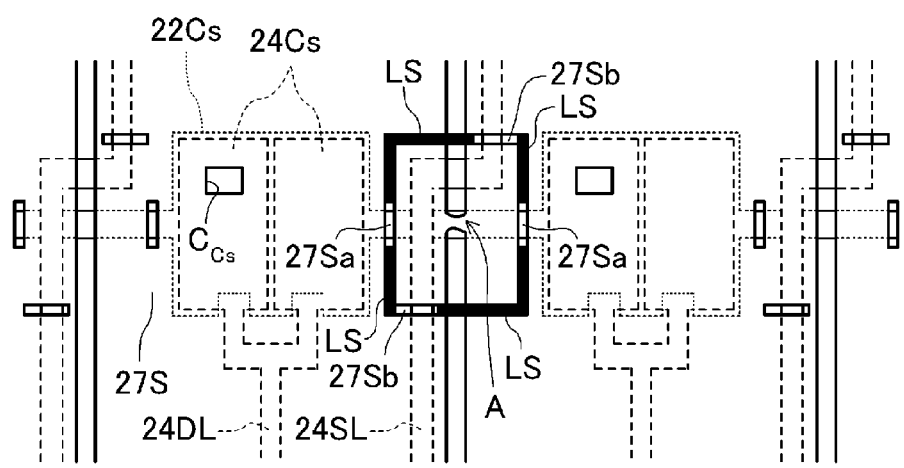
FIG. 17 is a view showing a short circuit defect repair method for an active matrix substrate in modification example of Embodiment 2.
Figure 18:
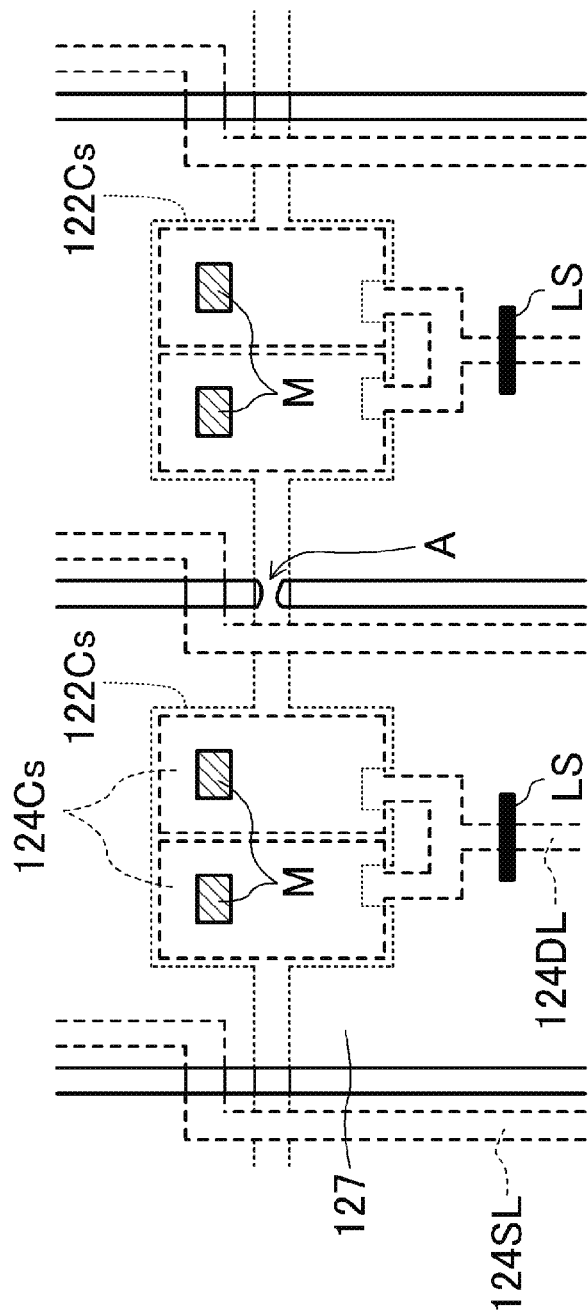
FIG. 18 is a view showing a conventional short circuit defect repair method.

In Embodiment 2, a repair hole provided so as to straddle the storage capacitance wiring line 22CsL continuing with a repair hole provided so as to straddle the source wiring lines 24SL, and forming an "L"-shaped repair hole 27S as a whole, was described, but as shown in FIG. 16, a repair hole 27Sa provided so as to straddle a storage capacitance wiring line 22CsL and a repair hole 27Sb provided so as to straddle a source wiring line 24SL may be provided non-continually and independently. In this case, as shown in FIG. 17, the areas that continue to both the repair hole 27Sa and the repair hole 27Sb are configured to be laser radiation areas LS and undergo laser radiation to be able to electrically isolate the short circuit defect portion A from the two short circuited pixel electrodes 27. In this case, the surface area of the repair hole 27S can be made smaller than in Embodiment 2, and the aperture ratio of the active matrix substrate 20 can be made larger by that amount.

Other Embodiments

The embodiments above described pixel electrodes 27 and source wiring lines 24SL disposed partially overlapping, but the pixel electrode 27 and the source wiring lines 24SL may also be arranged not overlapping.

The embodiments above described a liquid crystal display device that uses $UV^2A$ liquid crystal, but the embodiments of the present invention may also use Multi-domain Vertical Alignment liquid crystal (MVA liquid crystal), for example. Even in such a case, when two adjacent pixel electrodes short circuit above the storage capacitance wiring line, then repair of the short circuit defect can be performed without turning the entire pixel into a dark spot by each pixel electrode having slit-shaped repair holes provided so as to straddle the storage capacitance wiring line on intersections of the peripheries of the pixel electrodes and the storage capacitance wiring line.

However, in MVA liquid crystal, slits are provided in the pixel electrodes for orientation of the liquid crystal molecules, so an aperture ratio as large as with $UV^2A$ liquid crystal cannot be obtained. Therefore, by implementing the present invention in a liquid crystal display device with $UV^2A$ liquid crystal, the effect of allowing for short circuit defect repair without significantly reducing the aperture ratio can be obtained to a greater degree.

INDUSTRIAL APPLICABILITY

The present invention is useful for an active matrix substrate, a display device, and a short circuit defect repair method for an active matrix substrate. More specifically, the present invention is useful for: an active matrix substrate where, when adjacent pixel electrodes short circuit above a storage capacitance wiring line, repair of short circuit defects is possible without lowering display quality and without significantly lowering the aperture ratio; a display device provided with the active matrix substrate; and a short circuit defect repair method that repairs the short circuit defects.

DESCRIPTION OF REFERENCE CHARACTERS

D display area
F non-display area
10 liquid crystal display device
20 active matrix substrate
21 substrate
22CsL storage capacitance wiring line
22GL gate wiring line
22SL source auxiliary wiring line
23 gate insulating film
24SL source wiring line
26 interlayer insulating film
27 pixel electrode
27S repair hole
27Sa repair hole (repair hole provided so as to straddle storage capacitance wiring line)
27Sb repair hole (repair hole provided so as to straddle source wiring line)
30 opposite substrate
40 liquid crystal layer (display medium layer)

The invention claimed is:

1. An active matrix substrate having a non-display area arranged in a periphery thereof and a display area surrounded by the non-display area, the display area having a plurality of pixels arranged in a matrix therein, the active matrix substrate comprising:
   a substrate as a component of the active matrix substrate;
   a plurality of gate wiring lines disposed in parallel with each other on the substrate;
   a plurality of storage capacitance wiring lines that form storage capacitance elements for the respective pixels, the storage capacitance wiring lines being disposed on the substrate so as to extend in parallel with the plurality of gate wiring lines, and so as to go across each of the pixels;
   a gate insulating film disposed on the substrate so as to cover the plurality of gate wiring lines and the plurality of storage capacitance wiring lines;
   a plurality of source wiring lines disposed on the gate insulating film, the plurality of source wiring lines being in parallel with each other and intersecting the plurality of gate wiring lines and the plurality of storage capacitance wiring lines;
   a plurality of switching elements disposed at respective intersections of the plurality of gate wiring lines and the plurality of source wiring lines;
   an interlayer insulating film disposed on the gate insulating film so as to cover the plurality of source wiring lines, and
   a plurality of pixel electrodes disposed on the interlayer insulating film for the respective plurality of pixels,
   wherein a slit-shaped repair hole for repairing a short circuit defect between adjacent pixel electrodes is provided in each of the pixel electrodes so as to straddle the storage capacitance wiring line, the slit-shaped repair hole being provided adjacent to at least one intersection of the storage capacitance wiring line and two opposing boundary lines of the pixel electrode,
   wherein each of the pixel electrodes has a slit-shaped repair hole that straddles the source wiring line that is adjacent thereto, and
   wherein in each of the pixel electrodes, the repair hole provided so as to straddle the storage capacitance wiring line continues with the repair hole provided so as to straddle the source wiring line.

2. The active matrix substrate according to claim 1, wherein the repair hole is provided adjacent to each of the intersections of the storage capacitance wiring line and the two opposing boundary lines of the pixel electrode.

3. The active matrix substrate according to claim 1, wherein a slit width of each of the repair holes is 5 to 6 µm, and a slit length thereof is 15 to 25 µm.

4. A display device, comprising: the active matrix substrate according to claim 1; an opposite substrate arranged opposing the active matrix substrate; and a display medium layer disposed therebetween.

5. The display device according to claim 4, wherein the display medium layer is a liquid crystal layer.

6. An active matrix substrate short circuit defect repair method for repairing a short circuit defect when two adjacent pixel electrodes short circuit above a storage capacitance wiring line in an active matrix substrate, the active matrix substrate having a non-display area arranged in a periphery thereof and a display area surrounded by the non-display area, the display area having a plurality of pixels arranged in a matrix therein,
   the active matrix substrate comprising:
      a substrate as a component of the active matrix substrate;
      a plurality of gate wiring lines disposed in parallel with each other on the substrate;
      a plurality of storage capacitance wiring lines that form storage capacitance elements for the respective pixels, the storage capacitance wiring lines being disposed on the substrate so as to extend in parallel with the plurality of gate wiring lines, and so as to go across each of the pixels;
      a gate insulating film disposed on the substrate so as to cover the plurality of gate wiring lines and the plurality of storage capacitance wiring lines;
      a plurality of source wiring lines disposed on the gate insulating film, the plurality of source wiring lines being in parallel with each other and intersecting the plurality of gate wiring lines and the plurality of storage capacitance wiring lines;
      a plurality of switching elements disposed at respective intersections of the plurality of gate wiring lines and the plurality of source wiring lines;
      an interlayer insulating film disposed on the gate insulating film so as to cover the plurality of source wiring lines; and
      a plurality of pixel electrodes disposed on the interlayer insulating film for the respective plurality of pixels,
      wherein a slit-shaped repair hole for repairing a short circuit defect between adjacent pixel electrodes is provided in each of the pixel electrodes so as to straddle the storage capacitance wiring line, the slit-shaped repair hole being provided adjacent to at least one intersection of the storage capacitance wiring line and two opposing boundary lines of the pixel electrode,
      wherein each of the pixel electrodes has a slit-shaped repair hole that straddles the source wiring line that is adjacent thereto, and
      wherein in each of the pixel electrodes, the repair hole provided so as to straddle the storage capacitance wiring line continues with the repair hole provided so as to straddle the source wiring line, the method comprising:

when two pixel electrodes adjacent to each other short circuit over the storage capacitance wiring line: positioning a short circuit defect portion inside an area enclosed by the repair holes and laser radiation areas that continue, so as not to overlap the storage capacitance wiring line, to the repair holes, and performing laser radiation on the laser radiation areas, thereby electrically isolating the short circuit defect portion where the short circuit occurred from at least one of the pixel electrodes.

7. The active matrix substrate short circuit defect repair method according to claim 6, wherein the repair holes are provided adjacent to each of the intersections of the storage capacitance wiring line and the two opposing boundary lines of the pixel electrode, and wherein a short circuit defect portion where the short circuit has occurred is electrically isolated from the two pixel electrodes by positioning the short circuit defect portion inside the area enclosed by the repair holes and laser radiation areas that continue, so as not to overlap the storage capacitance wiring line, to the repair holes, and by performing laser radiation on the laser radiation areas.

8. The active matrix substrate short circuit defect repair method according to claim 6, wherein a slit width of each of the repair holes is 5 to 6 μm, and a slit length thereof is 15 to 25 μm.

* * * * *